(12) United States Patent
Izumizawa et al.

(10) Patent No.: US 6,635,988 B1
(45) Date of Patent: Oct. 21, 2003

(54) ORGANIC EL DEVICE

(75) Inventors: Takenori Izumizawa, Kanagawa (JP); Kenji Furukawa, Kanagawa (JP)

(73) Assignee: Chisso Corporation, Osaka (JP)

(*) Notice: Subject to any disclaimer, the term of this patent is extended or adjusted under 35 U.S.C. 154(b) by 0 days.

(21) Appl. No.: 09/958,025

(22) PCT Filed: Apr. 4, 2000

(86) PCT No.: PCT/JP00/02174
§ 371 (c)(1), (2), (4) Date: Oct. 2, 2001

(87) PCT Pub. No.: WO00/60904
PCT Pub. Date: Oct. 12, 2000

(30) Foreign Application Priority Data

May 4, 1999 (JP) ............................................. 11-97794

(51) Int. Cl.[7] .............................. H01J 1/62; H01J 63/04
(52) U.S. Cl. ......................... 313/504; 313/506; 313/512
(58) Field of Search ......................... 313/512, 498–511

(56) References Cited

U.S. PATENT DOCUMENTS

| | | | | |
|---|---|---|---|---|
| 4,767,679 A | * | 8/1988 | Kawachi ..................... | 428/690 |
| 5,047,687 A | | 9/1991 | VanSlyke | |
| 5,107,175 A | * | 4/1992 | Hirano et al. ............... | 313/512 |
| 5,189,405 A | * | 2/1993 | Yamashita et al. .......... | 313/512 |
| 5,652,067 A | * | 7/1997 | Ito et al. ..................... | 428/690 |
| 5,771,562 A | * | 6/1998 | Harvey et al. .............. | 29/592.1 |
| 5,811,177 A | | 9/1998 | Shi et al. | |
| 6,198,217 B1 | * | 3/2001 | Suzuki et al. ............... | 313/504 |
| 2003/0017297 A1 | * | 1/2003 | Song et al. ................... | 428/68 |

FOREIGN PATENT DOCUMENTS

| | | |
|---|---|---|
| JP | 57-51781 | 3/1982 |
| JP | 7-169567 | 1/1995 |
| JP | 9-148066 | 6/1997 |
| JP | 10-275680 | 10/1998 |
| JP | 10-312883 | 11/1998 |
| JP | 10-335060 | 12/1998 |
| JP | 11-97169 | 4/1999 |

* cited by examiner

*Primary Examiner*—Vip Patel
*Assistant Examiner*—German Colón
(74) *Attorney, Agent, or Firm*—Sughrue Mion, PLLC

(57) ABSTRACT

An organic EL device having an organic EL structure which moisture does not enter and maintaining stable luminescence characteristics for a long period of time. An anode (2), and organic substance layer (3), and a cathode (4) are formed on a transparent substrate (1). A combination (insulating layer-moisture reaction layer combination) including an insulating layer (5) and a moisture reaction layer (6) formed on the insulating layer (5) covers an organic EL structure including the organic substance layer, the cathode, and a portion of the anode. The material of the moisture reaction layer (6) is a metal having a Pauling's electronegativity of less than 1.2. There are large differences in the number of dark spots produced and the growth of the dark spots between a metal; e.g., Ca (1.0), whose electronegativity is less than 1.2 and a metal; e.g., Mg (1.2), whose electronegativity is 1.2.

7 Claims, 3 Drawing Sheets

ORGANIC EL DEVICE

TECHNICAL FIELD

The present invention relates to an organic electroluminescent device (hereinafter referred to as "organic EL device"), and more particularly, to an organic EL device having an improved seal structure.

BACKGROUND ART

C. W. Tang has disclosed a new organic EL device in Japanese Patent Application Laid-Open (kokai) No. 57-51781, and since then, techniques relating to organic EL devices have been developed rapidly, realizing production of EL devices providing high-luminance, bright images and production of multi-color EL devices. However, these EL devices have a disadvantageously short service life, leaving a drawback to be solved.

Techniques for attaining organic EL devices of long service life are focused mainly on the following points: development of highly durable organic compounds, and improvement in seal technique for preventing intrusion of outside contaminants, particularly moisture and oxygen. As is well known, when the moisture which has intruded into an organic EL structure migrates from faults of the cathode surface into a combination comprising an organic substance layer sandwiched by a pair of electrodes, delamination between the organic substance layer and the cathode occurs, resulting in generation of dark spots (black spots); i.e., sites where light emission cannot be attained, due to failure of electrical conduction.

In order to suppress the aforementioned generation of dark spots, intrusion of moisture into the organic EL structure must be prevented. Conventionally, there have been developed several organic EL devices equipped with means for preventing intrusion of moisture into the organic EL structure; such as an organic EL device in which a protective layer containing a desiccant and a seal layer are laminated to the outside of a combination comprising an anode, an organic substance layer, and a cathode, these elements being laminated (Japanese Patent Application Laid-Open (kokai) No. 7-169567), and an organic EL device including a combination formed of a pair of electrodes with an organic substance layer sandwiched therebetween, which combination is accommodated in an airtight casing for sealing where drying means such as barium oxide, calcium oxide, calcium sulfate, or calcium chloride is provided in such a manner that they do not contact the combination (Japanese Patent Application Laid-Open (kokai) No. 9-148066).

However, the aforementioned conventional organic EL devices cannot sufficiently prevent intrusion of moisture into their organic EL structures. Specifically, in both the aforementioned organic EL device in which a protective layer containing a desiccant is laminated to the outside of the structure and in the aforementioned organic EL device including drying means provided in a airtight casing, moisture which has intruded into the organic EL device cannot be sufficiently absorbed in a desiccant, leading to intrusion of moisture into the organic EL structure and disadvantageously generating dark spots.

The present invention has been accomplished to overcome the aforementioned drawbacks, and an object of the present invention is to provide an organic EL device which maintains stable luminescent characteristics for a long period of time by preventing intrusion of moisture into the organic EL structure of the device.

DISCLOSURE OF THE INVENTION

The present inventors have carried out extensive studies in order to attain the aforementioned object, and have found that by forming a combination comprising an insulating layer and a moisture reaction layer, particularly containing a metal having a Pauling's electronegativity of less than 1.2, on the insulating layer such that the combination covers an organic EL structure comprising an anode, an organic substance layer, and a cathode, the metal is immediately reacted with moisture, to thereby effectively prevent intrusion of moisture into the organic EL structure and short circuits between the organic EL structure and the moisture reaction layer, thereby attaining production of an organic EL device which generates no dark spots and maintains stable luminescent characteristics for a long period of time. The present invention has been accomplished on the basis of this finding.

Accordingly, the present invention provides the following organic EL devices (1) and (2).

(1) An organic EL device having an anode provided on the surface of a transparent substrate, a cathode facing the anode, and an organic substance layer provided between the anode and the cathode and containing a light-emitting layer, characterized in that at least one combination comprising an insulating layer and a moisture reaction layer provided on the insulating layer (insulating layer-moisture reaction layer combination) is provided such that the combination covers an organic EL structure including the organic substance layer, the cathode, and a portion of the anode.

(2) An organic EL device according to (1), wherein the moisture reaction layer contains a metal having a Pauling's electronegativity of less than 1.2.

Preferably, the present invention employs the following structural features (3) to (9) as shown in the below-described Embodiments.

(3) An organic EL device according to (2), wherein the moisture reaction layer is formed substantially of a metal having a Pauling's electronegativity of less than 1.2.

(4) An organic EL device according to any one of (1) to (3), wherein an anode insulating layer is provided between the moisture reaction layer and the anode.

(5) An organic EL device according to any one of (1) to (4), wherein a seal substrate is provided above the organic EL structure including the organic substance layer, the cathode, a portion of the anode, and the insulating layer-moisture reaction layer combination, and the seal substrate is fixed to the transparent substrate by use of an adhesive for a seal substrate (the below-described first mode).

(6) An organic EL device according to any one of (1) to (4), wherein the organic EL structure including the organic substance layer, the cathode, a portion of the anode, and the insulating layer-moisture reaction layer combination is molded by use of a seal molding agent (the below-described second mode).

(7) An organic EL device according to any one of (1) to (4), wherein a preliminary moisture reaction layer comprising a water-reactive substance dispersed in a polymer binder is provided over the organic EL structure including the organic substance layer, the cathode, a portion of the anode, and the insulating layer-moisture reaction layer combination, and the preliminary moisture reaction layer is molded by use of a seal-molding agent.

(8) An organic EL device according to (7), wherein the water-reactive substance is at least one metal having a Pauling's electronegativity of less than 1.2.

(9) An organic EL device according to (7) or (8), wherein the polymer binder is a heat-curable or photo-curable resin.

BEST MODES FOR CARRYING OUT THE INVENTION

The modes for carrying out the present invention will next be described with reference to the drawings.

Embodiment 1

Figure 1:
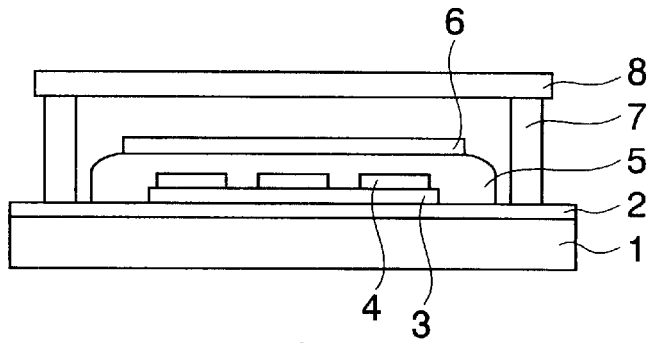
FIG. 1 shows a cross-sectional view of a first example of a first mode of the present invention.

FIG. 1 shows a cross-sectional view of a first example of a first mode of the present invention. On a transparent substrate; e.g., a glass substrate 1, an organic EL structure comprising an anode 2 made of ITO (indium tin oxide), an organic substance layer 3 including a light-emitting layer, and a cathode 4 is provided. No particular limitations are imposed on the materials, structures, etc. of the layers constituting the organic EL structure. Specifically, other than ITO, materials such as tin oxide (NESA), gold, silver, platinum, and copper can be used for producing the anode, and materials such as indium, magnesium, aluminum, magnesium-indium alloy, magnesium-silver alloy, and magnesium-aluminum alloy can be used for producing the cathode. The organic EL structure can be arranged to an arbitrary structure such as (1) anode/light-emitting layer/cathode; (2) anode/hole-transporting layer/light-emitting layer/electron-transporting layer/cathode; (3) anode/light-emitting layer/electron-transporting layer/cathode; or (4) anode/hole-transporting layer/light-emitting layer/cathode.

On the aforementioned organic EL structure, an insulating layer 5 is provided, to thereby completely cover the organic substance layer 3 and the cathode 4. A moisture reaction layer 6 is formed on the insulating layer 5, preferably to a thickness of 0.2–1 $\mu$m. In other words, a combination which comprises the insulating layer 5 and the moisture reaction layer 6 formed on the insulating layer (insulating layer-moisture reaction layer combination) is provided such that the organic EL structure comprising the organic substance layer 3, the cathode 4, and a portion of the anode 2 is covered with the combination. The insulating layer 5 is provided so as to prevent short circuit between the moisture reaction layer 6 and the organic EL structure. A seal substrate 8 is provided above the organic EL structure on which the insulating layer-moisture reaction layer combination comprising the insulating layer 5 and the moisture reaction layer 6 has been formed. The seal substrate 8 is fixed to the glass substrate 1 via an adhesive 7 for bonding a seal substrate.

The moisture reaction layer 6 is formed of a metal which readily reacts with water at room temperature; i.e., a metal having a Pauling's electronegativity of less than 1.2 such as metallic lithium (Pauling's electronegativity: 1.0); metallic sodium (negativity: 0.9); metallic potassium (negativity: 0.8); metallic rubidium (negativity: 0.8); metallic cesium (negativity: 0.7); metallic calcium (negativity: 1.0); metallic strontium (negativity: 1.0); or metallic barium (negativity: 0.9). Although the moisture reaction layer 6 may be formed of a mixture containing a metal having a Pauling's electronegativity of less than 1.2 and another substance, the layer is preferably formed of substantially only metal having a Pauling's electronegativity of less than 1.2, from the viewpoint of the effect of preventing intrusion of moisture into the organic EL structure.

When the moisture reaction layer 6 has a thickness of less than 0.05 $\mu$m, the amount of metal contained in the moisture reaction layer 6 decreases, to thereby degrade performance of preventing moisture intrusion into an organic EL structure. Thus, the service life of an organic EL device containing the organic EL structure is shortened, making practical use thereof difficult. The moisture reaction layer 6 is preferably thicker, since the thicker the layer, the longer the service life of the organic EL device including the layer. However, when the thickness of the moisture reaction layer 6 increases excessively, the layer may be cracked due to the difference in thermal expansion coefficient between the layer and the insulating layer 5 provided therebelow. Thus, the upper limit of the thickness is approximately 3 $\mu$m. Therefore, the thickness of the moisture reaction layer 6 is preferably about 0.05–3 $\mu$m, more preferably about 0.05–1 $\mu$m, so as to attain higher reliability.

The insulating layer 5 is provided in order to prevent short circuit between the moisture reaction layer 6 and the organic EL structure. Thus, no particular limitation is imposed on the material for forming the insulating layer 5, and any insulating material can be used so long as the conductivity thereof is $10^{-14}$ S/m or less. Specific examples of the insulating material include metal oxides, metal nitrides, metal carbides, metal sulfides, metal chlorides, metal fluorides, metal sulfates, organic compounds, and organometallic compounds. The insulating layer 5 may have a plurality of layers formed of the aforementioned insulating materials.

The adhesive 7 for bonding a seal substrate is preferably formed of moisture-impermeable resin. Examples of the resin include heat-curable or photo-curable epoxy resins, acrylic resins, polyimide resins, silicone-polyimide resins, silicone resins, silicone rubber, and polyolefin resins.

The seal substrate 8 is formed of a moisture-impermeable substance. Specific examples thereof include glass and metals such as stainless steel and aluminum.

Embodiment 2

Figure 2:
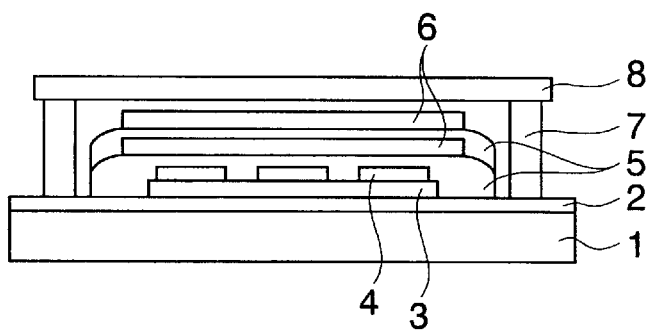
FIG. 2 shows a cross-sectional view of a second example of the first mode of the present invention.

FIG. 2 shows a cross-sectional view of a second example of the first mode of the present invention. On a glass substrate 1, an anode 2 made of ITO, an organic substance layer 3, and a cathode 4 are formed. An insulating layer 5 is provided on the formed structure, and a moisture reaction layer 6 is provided on the insulating layer. The feature is identical to that of the first example shown in FIG. 1. In the second example, two insulating layer-moisture reaction layer combinations comprising the insulating layer 5 and the moisture reaction layer 6 are provided successively. In other words, as described in the first example, the thickness of the moisture reaction layer 6 cannot be increased greatly, since a thick moisture reaction layer may be cracked. Instead, a plurality of moisture reaction layers 6 are employed, and an insulating layer 5 is inserted between two moisture reaction layers, to thereby reduce the thickness of each moisture reaction layer 6 and prevent cracking in the layer. In addition, the amount of metal contained in the moisture reaction layers is increased by means of increasing the overall thickness of the moisture reaction layers 6, and the performance of preventing intrusion of moisture into an organic EL is enhanced, to thereby prolong the service life of an organic EL device including the EL structure. The number of the insulating layer-moisture reaction layer combinations to be formed, comprising the insulating layer 5 and the moisture reaction layer 6, is preferably as high as possible. However, increasing the number of the combinations imposes an increase in work steps and material costs, to thereby elevate production costs. Thus, the number of the combinations cannot be increased without limitation.

Embodiment 3

Figure 3:
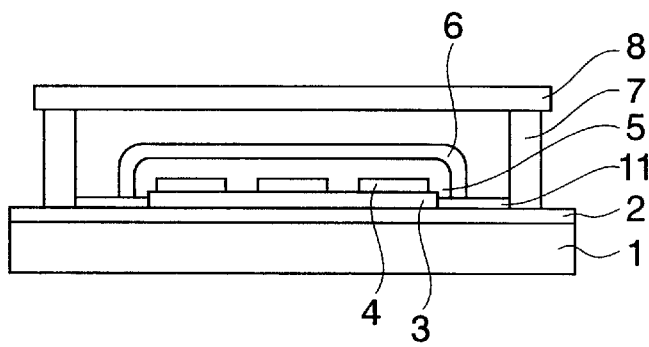
FIG. 3 shows a cross-sectional view of a third example of the first mode of the present invention.

FIG. 3 shows a cross-sectional view of a third example of the first mode of the present invention. The third example is drawn an organic EL device similar to that shown in FIG. 1, with an anode insulating layer 11 being provided on a portion of the surface of the anode 2 where the organic substance layer 3 is not provided, and the moisture reaction layer 6 being extended to a side surface of the insulating layer 5, to thereby prevent intrusion of moisture penetrating the side surface of the insulating layer 5 into the organic substance layer 3, particularly into a side surface of the organic substance layer 3.

No particular limitation is imposed on the material for forming the anode insulating layer 11, and any insulating materials similar to those forming the insulating layer 5 can be used so long as the conductivity thereof is $10^{-14}$ S/m or less. Specific examples of the insulating material include metal oxides, metal nitrides, metal carbides, metal sulfides, metal chlorides, metal fluorides, metal sulfates, organic compounds, and organometallic compounds. The anode insulating layer 11 may have a plurality of layers formed of the aforementioned insulating materials.

The anode insulating layer 11 can also be applied to the second example shown in FIG. 2. In the first and second examples, extension of the moisture reaction layer 6 to the side surface of the insulating layer 5 is difficult, because short circuits with the anode 2 may occur if the moisture reaction layer 6 is extended to the side surface of the insulating layer 5. In contrast, when the anode insulating layer 11 is provided, short circuits between the moisture reaction layer 6 and the anode 2 are prevented. This enables extension of the moisture reaction layer 6 such that the layer and the anode insulating layer 11 are in contact with each other, to thereby further enhance the effect of preventing moisture intrusion and prolonging the service life.

Embodiment 4

Figure 4:
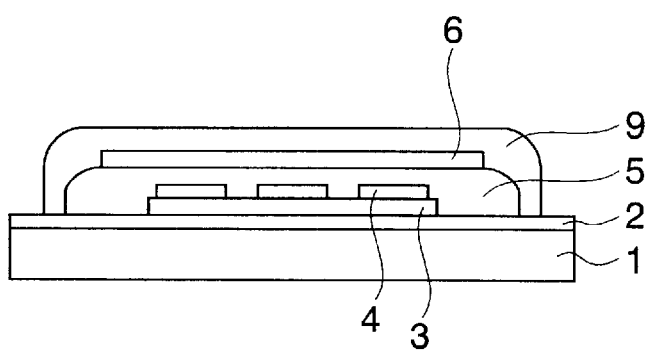
FIG. 4 shows a cross-sectional view of a first example of a second mode of the present invention.

FIG. 4 shows a cross-sectional view of a first example of a second mode of the present invention. On a glass substrate 1, an organic EL structure comprising an anode 2 made of ITO, an organic substance layer 3, and a cathode 4 is formed. An insulating layer 5 is provided on the organic EL structure, to thereby completely cover the organic substance layer 3 and the cathode 4. A moisture reaction layer 6 having a thickness of 0.05–0.1 μm is provided on the insulating layer. The materials for constituting the insulating layer 5 and the moisture reacting layer 6 are similar to those described above. The organic EL structure provided with the insulating layer 5 and the moisture reaction layer 6 is molded with a seal-molding agent, to thereby form a seal molding 9 which seals in the organic EL structure.

The seal molding 9 is provided so as to prevent reaction of the moisture reaction layer 6 with moisture contained in air caused by direct contact of the layer with air. Thus, the seal molding 9 is preferably formed of moisture-impermeable resin. Examples of the resin include heat-curable or photo-curable epoxy resins, acrylic resins, polyimide resins, silicone-polyimide resins, silicone resins, silicone rubber, and polyolefin resins. Use of the seal molding 9 is advantageous, since the cost thereof is lower as compared with use of a seal substrate.

Embodiment 5

Figure 5:
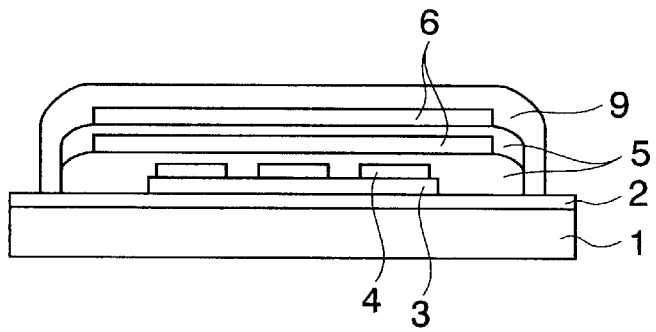
FIG. 5 shows a cross-sectional view of a second example of the second mode of the present invention.

FIG. 5 shows a cross-sectional view of a second example of the second mode of the present invention. On a glass substrate 1, an anode 2 made of ITO, an organic substance layer 3, and a cathode 4 are formed. An insulating layer 5 is provided on the formed structure, and a moisture reaction layer 6 is provided on the insulating layer. The feature is identical to that of the first example shown in FIG. 4. In the second example, two insulating layer-moisture reaction layer combinations comprising the insulating layer 5 and the moisture reaction layer 6 are provided successively. The reason for providing a plurality of insulating layer-moisture reaction layer combinations is the same as described in connection with the example shown in FIG. 2, and the same effect can be attained. The organic EL structure provided with the insulating layer 5 and the moisture reaction layer 6 is molded with a seal-molding agent, to thereby form a seal molding 9 which seals in the organic EL structure.

Embodiment 6

Figure 6:
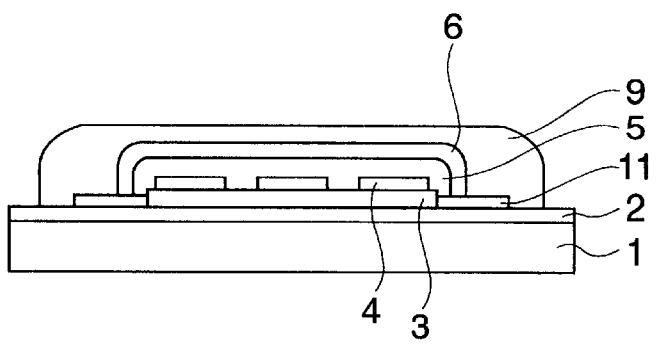
FIG. 6 shows a cross-sectional view of a third example of the second mode of the present invention.

FIG. 6 shows a cross-sectional view of a third example of the second mode of the present invention. The third example is drawn to an organic EL device similar to that shown in FIG. 4, with an anode insulating layer 11 being provided on a portion of the surface of the anode 2 where the organic substance layer 3 is not provided, and the moisture reaction layer 6 being extended to a side surface of the insulating layer 5, to thereby prevent intrusion of moisture penetrating the side surface of the insulating layer 5 into the organic substance layer 3, particularly into a side surface of the organic substance layer 3. The third example is based on a concept similar to that of the example shown in FIG. 3. Thus, a substance employed in the example shown in FIG. 3 is used to form the anode insulating layer 11. The anode insulating layer 11 is also applicable to the second example shown in FIG. 5.

Embodiment 7

Figure 7:
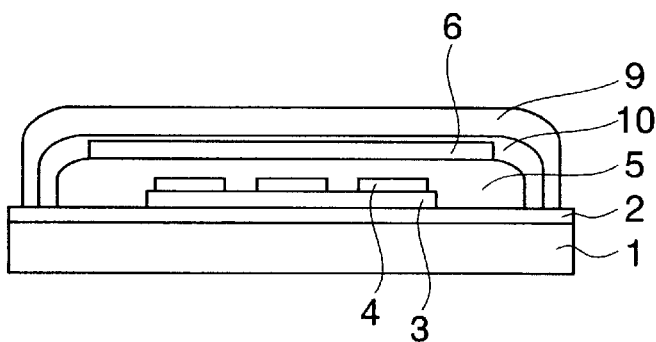
FIG. 7 shows a cross-sectional view of a first example of a third mode of the present invention.

FIG. 7 shows a cross-sectional view of a first example of a third mode of the present invention. On a glass substrate 1, an organic EL structure comprising an anode 2 made of ITO, an organic substance layer 3, and a cathode 4 is formed. On the thus-formed structure, an insulating layer 5 and a moisture reaction layer 6 are successively provided. The feature is identical to that of the example shown in FIG. 4. In the present example, a preliminary moisture reaction layer 10 is provided so as to cover the organic EL structure provided with the insulating layer 5 and the moisture reaction layer 6, and the preliminary moisture reaction layer is molded with a seal-molding agent, to thereby form a seal molding 9 which seals in the organic EL structure. Briefly, the present example includes the preliminary moisture reaction layer 10 which is inserted between the insulating layer-moisture reaction layer combination and the seal molding 9 provided in the organic EL device as shown FIG. 4.

The preliminary moisture reaction layer 10 is provided so as to prevent intrusion of moisture into the organic EL structure in a further reliable manner, and is formed from a substance comprising a water-reactive substance dispersed in a polymer binder. The water-reactive substance is preferably formed of a substance identical to a water-reactive substance employed in the moisture reaction layer 6; i.e., at least one metal having a Pauling's electronegativity of less than 1.2. The polymer binder is preferably formed of moisture-impermeable resin. Examples of the resin include heat-curable or photo-curable epoxy resins, acrylic resins, polyimide resins, silicone-polyimide resins, silicone resins, silicone rubber, and polyolefin resins. The seal molding 9 is formed of a seal molding identical with that described in connection with the example shown in FIG. 4.

More specifically, the preliminary moisture reaction layer 10 can be formed through any of several methods; e.g., a method in which a water-reactive substance powder is dispersed in a heat-curable or photo-curable polymer binder, to thereby yield a flowable mixture liquid; the liquid is applied; and the applied liquid is cured by heat or light; and a method in which a polymer binder and a water-reactive substance are subjected to co-vapor-deposition.

When a flowable mixture liquid containing a water-reactive agent powder dispersed in a polymer binder is used, the amount of the powder dispersed in the polymer binder is adjusted to approximately 0.5–5 wt. %. When the amount is in excess of 5 wt. %, the flowability of the liquid decreases, leading to poor applicability, whereas when the amount is less than 0.2 wt. %, the amount of the water-reactive substance becomes insufficient, to thereby reduce the effect of preventing moisture intrusion.

When the latter method; i.e., co-vapor-deposition of a polymer binder and a water-reactive substance, is employed, the amount of the water-reactive substance is not particularly limited. However, when the amount of the water-reactive substance increases, the preliminary moisture reaction layer 10 becomes conductive. Such a preliminary moisture reaction layer causes short circuits between the layer and the anode 2 when the preliminary moisture reaction layer 10 and the anode 2 are in contact with each other as shown in FIG. 7. Therefore, the amount of the water-reactive substance must be adjusted so as to fall within the range in which the preliminary moisture reaction layer 10 maintains the insulation property.

The example shown in FIG. 7 includes only one insulating layer-moisture reaction layer combination comprising the insulating layer 5 and the moisture reaction layer 6. However, according to the examples shown in FIGS. 2 and 5, two or more combinations may be provided. As mentioned above, the obtained effect becomes greater as the number of combination increases.

Embodiment 8

Figure 8:
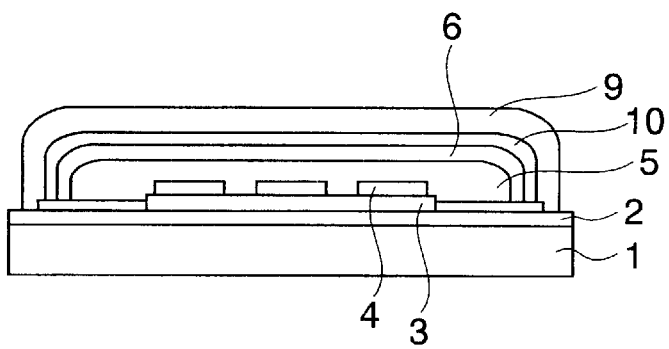
FIG. 8 shows a cross-sectional view of a second example of the third mode of the present invention.

FIG. 8 shows a cross-sectional view of a second example of the third mode of the present invention. The second example is drawn to an organic EL device similar to that shown in FIG. 7, with an anode insulating layer 11 being provided on a portion of the surface of the anode 2 where the organic substance layer 3 is not provided, and the moisture reaction layer 6 and a preliminary moisture reaction layer 10 being extended to a side surface of the insulating layer 5, to thereby prevent intrusion of moisture penetrating the side surface of the insulating layer 5 into the organic substance layer 3, particularly into a side surface of the organic substance layer 3. The second example is based on a concept similar to that of the examples shown in FIGS. 3 and 6. Thus, a substance employed in the example shown in FIG. 3 is used to form the anode insulating layer 11.

As mentioned above, when the amount of the water-reactive substance increases, the preliminary moisture reaction layer 10 becomes conductive. Thus, the amount of the water-reactive substance must be controlled so as to prevent short circuits between the layer and the anode 2 when the preliminary moisture reaction layer 10 and the anode 2 are in contact with each other as shown in FIG. 7. In contrast, in the present example, since the anode insulating layer 11 is provided on a portion of the surface of the anode 2 where the organic substance layer 3 is not provided, no short circuits occur between the preliminary moisture reaction layer and the anode 2. Thus, the amount of the water-reactive substance to be incorporated into the preliminary moisture reaction layer 10 can be increased to an arbitrary value. As is easily understandable, the effect of preventing moisture intrusion becomes greater as the water-reactive substance content increases. In addition, a method in which a polymer binder and a water-reactive substance are subjected to co-vapor-deposition can be employed, without limitation, so as to produce the structure of the present example. Briefly, the method can be employed regardless of the amount of the water-reactive substance; i.e., regardless of whether the preliminary moisture reaction layer 10 is conductive or insulating.

According to the third mode, production cost increases due to provision of the preliminary moisture reaction layer 10, but the effect of preventing moisture intrusion is more excellent that that attained in the second mode, to thereby further prolong the service life of the organic EL device.

EXAMPLES

The present invention will next be described by way of Examples and Comparative Examples.

Example 1

In a manner similar to that employed for the device as shown in FIG. 1, an anode 2 made of ITO, an organic substance layer 3, and a cathode 4 were provided on a glass substrate 1, to thereby form an organic EL structure. An insulating layer 5 having a thickness of 1 $\mu$m was provided on the organic EL structure through vacuum vapor deposition by use of tris(8-quinolinato)aluminum. On the insulating layer, metallic calcium (Pauling's electronegativity: 1.0) was formed to a thickness of 0.5 $\mu$m through vacuum vapor deposition, to thereby provide a moisture reaction layer 6. Subsequently, photo-curable epoxy resin serving as an adhesive 7 for a seal substrate was applied to the glass substrate 1 so as to form a frame. A glass substrate serving as a seal substrate 8 was placed on the frame provided on the glass substrate 1, and the adhesive 7 for a seal substrate was cured.

Figure 9:
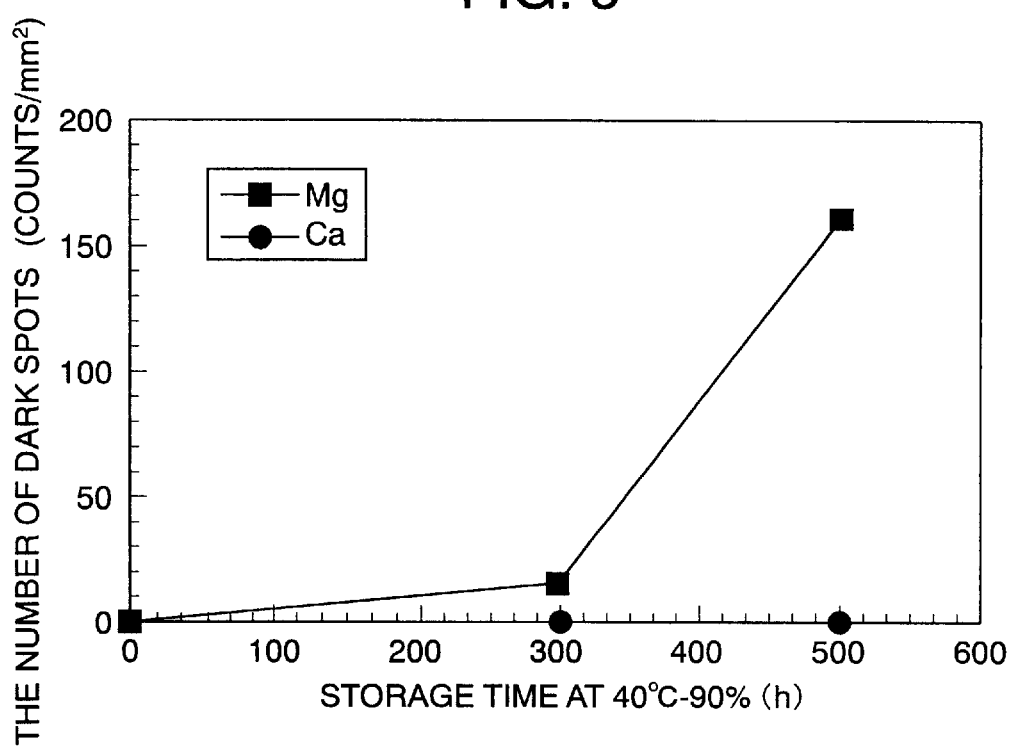
FIG. 9 is a graph showing the effect of a substance contained in the moisture reaction layer exerted on the number of produced dark spots.
Figure 10:
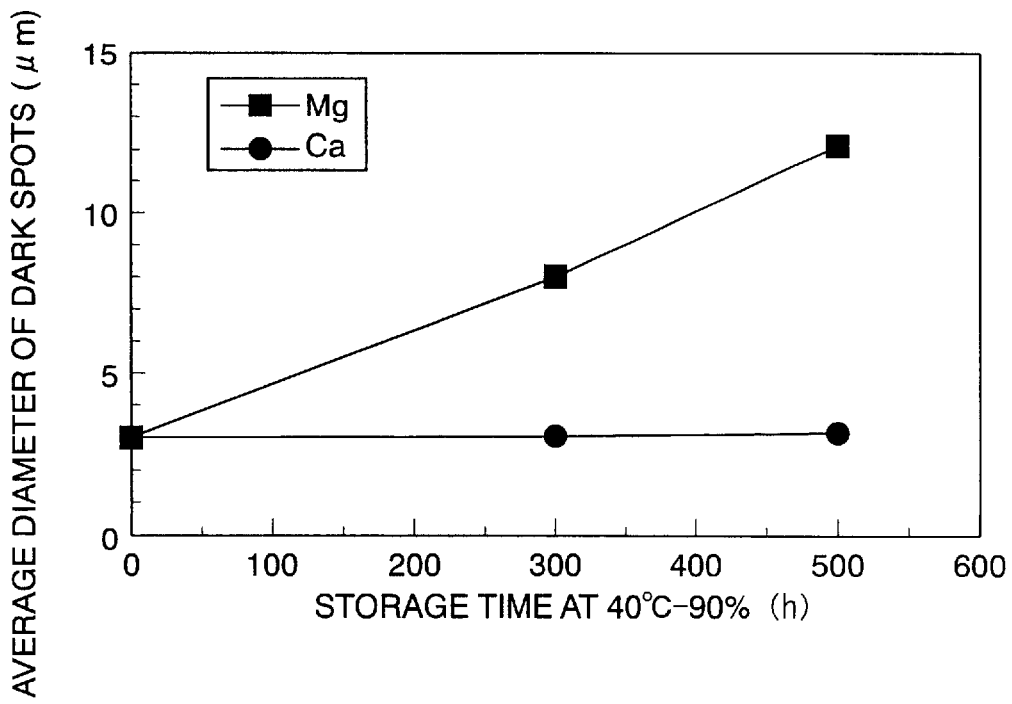
FIG. 10 is a graph showing the effect of a substance contained in the moisture reaction layer exerted on the average diameter of produced dark spots.

Immediately after bonding of the seal substrate, the light-emitting section of the thus-fabricated organic EL device was observed in terms of dark spots (black spots), by taking an enlarged photograph (magnification: ×30), and the number and the average diameter of the dark spots were measured. In a manner similar to that employed immediately after bonding of the seal substrate, enlarged photographs of the organic EL device were taken after completion of storage at 40° C. under a humidity of 90% for 300 hours and 500 hours, to thereby measure the number and the average diameter of the dark spots. The results are shown in FIG. 9 (the number of dark spots) and FIG. 10 (the average diameter of dark spots). As shown in FIGS. 9 and 10, substantially no dark spot growth was observed.

Comparative Example 1

In Comparative Example 1, the procedure of Example 1 was repeated, except that the moisture reaction layer 6 was formed by use of metallic magnesium (Pauling's electronegativity: 1.2) instead of metallic calcium, to thereby fabricate an organic EL device. Storage and measurement were carried out under conditions identical with those employed in Example 1. The measurement results are shown FIGS. 9 and 10. The results shown in FIGS. 9 and 10 confirm that considerable growth of dark spots occurred when the moisture reaction layer formed of metallic magnesium was used as compared with the case in which the moisture reaction layer formed of metallic calcium was used.

Example 2

The procedure of Example 1 was repeated, except that the moisture reaction layer 6 was formed by use of metallic lithium (Pauling's electronegativity: 1.0) instead of metallic calcium, to thereby fabricate an organic EL device. Storage and measurement were carried out under conditions identical with, those employed in Example 1. No substantial growth of dark spots was observed.

Example 3

The procedure of Example 1 was repeated, except that the moisture reaction layer 6 was formed by use of metallic sodium (Pauling's electronegativity: 0.9) instead of metallic calcium, to thereby fabricate an organic EL device. Storage and measurement were carried out under conditions identical with those employed in Example 1. No substantial growth of dark spots was observed.

Example 4

The procedure of Example 1 was repeated, except that the moisture reaction layer 6 was formed by use of metallic potassium (Pauling's electronegativity: 0.8) instead of metallic calcium, to thereby fabricate an organic EL device. Storage and measurement were carried out under conditions identical with those employed in Example 1. No substantial growth of dark spots was observed.

Example 5

The procedure of Example 1 was repeated, except that the moisture reaction layer 6 was formed by use of metallic strontium (Pauling's electronegativity: 1.0) instead of metallic calcium, to thereby fabricate an organic EL device. Storage and measurement were carried out under conditions identical with those employed in Example 1. No substantial growth of dark spots was observed.

Comparative Example 2

The procedure of Example 1 was repeated, except that the moisture reaction layer 6 was formed by use of aluminum (Pauling's electronegativity: 1.5) instead of metallic calcium, to thereby fabricate an organic EL device. Storage and measurement were carried out under conditions identical with those employed in Example 1. Considerable growth of dark spots was observed.

Example 6

In Example 6, the insulating layer 5 of the organic EL device shown in FIG. 1 was converted to an insulating layer of two-layer structure. An anode 2 made of ITO, an organic substance layer 3, and a cathode 4 were provided on a glass substrate 1, to thereby form an organic EL structure. On the organic EL structure, a tris(8-quinolinato)aluminum layer having a thickness of 1.0 $\mu$m was formed through vacuum vapor deposition, and on the thus-formed layer, a germanium monoxide (GeO) layer having a thickness of 100 nm was formed through vacuum vapor deposition, to thereby provide an insulating layer 5 of two-layer structure. On the insulating layer, metallic calcium (Pauling's electronegativity: 1.0) was formed to a thickness of 500 nm through vacuum vapor deposition, to thereby provide a moisture reaction layer 6. Subsequently, photo-curable epoxy resin serving as an adhesive 7 for a seal substrate was applied to the glass substrate 1 so as to form a frame. A glass substrate serving as a seal substrate 8 was placed on the frame provided on the glass substrate 1, and the adhesive 7 for a seal substrate was cured. Storage and measurement were carried out under conditions identical with those employed in Example 1. No substantial growth of dark spots was observed.

Comparative Example 3

The procedure of Example 6 was repeated, except that the moisture reaction layer 6 was formed by use of metallic magnesium instead of metallic calcium, to thereby fabricate an organic EL device. Storage and measurement were carried out under conditions identical with those employed in Example 1. Considerable growth of dark spots was observed.

Comparative Example 4

The procedure of Example 6 was repeated, except that the moisture reaction layer 6 was formed by use of aluminum instead of metallic calcium, to thereby fabricate an organic EL device. Storage and measurement were carried out under conditions identical with those employed in Example 1. Considerable growth of dark spots was observed.

The results of the Examples and the Comparative Examples indicate that remarkable difference in the growth of dark spots in accordance with the type of metal used in the moisture reaction layer 6. Studies on characteristics of the metal used in the layer reveal that the effect of preventing dark spot growth increases as the electronegativity of the metal decreases. The effect of preventing dark spot growth is confirmed to change drastically between metallic calcium and metallic magnesium on the electronegativity scale; i.e., at the borderline in terms of the requirement that Pauling's electronegativity be 1.2. In other words, a metal having a Pauling's negativity of less than 1.2 is suitable.

Pauling's electronegativity itself is defined as an electron-attracting power of a bonded atom, and serves as an index for the value of the bond energy between two different atoms A and B. When the difference in electronegativity between two atoms forming a chemical bond becomes greater, electrons are attracted more strongly to one atom, and the chemical bond has a more ionic characteristic. In addition, electronegativity also serves as an index of the electron-accepting or electron-donating property. The difference in electronegativity between a metal and water increases as the electronegativity of the metal decreases. The large difference in electronegativity is considered to strengthen the bond between the metal and water.

INDUSTRIAL APPLICABILITY

As described hereinabove, the present invention provides an organic EL device which generates no dark spots and maintains stable luminescence characteristics for a long period of time, by means of employing a moisture reaction layer formed of a metal having a Pauling's electronegativity of less than 1.2, to thereby remove water by causing to react water immediately with the metal. In addition, a plurality of insulating layer-moisture reaction layer combinations comprising the aforementioned moisture reaction layer and insulating layer are provided, to thereby further prolong service life. Employment in the moisture reaction layer of a metal having a Pauling's electronegativity of less than 1.2 is effective in both a device structure including a seal substrate and that including a seal-molding device structure.

In another mode, an anode insulating layer is provided on a portion of the surface of the anode where the organic substance layer is not provided, and the moisture reaction layer is extended to a side surface of the insulating layer, to thereby prevent intrusion of moisture penetrating the side surface of the insulating layer into the organic substance layer, resulting in further prolongation of service life. In addition, the amount of a water-reactive substance to be incorporated into the preliminary moisture reaction layer can be increased, to thereby further prolong the service life of the organic EL device.

What is claimed is:

1. An organic EL device having an anode provided on the surface of a transparent substrate, a cathode facing the anode, and an organic substance layer provided between the anode and the cathode and containing a light-emitting layer, characterized in that at least one combination comprising an insulating layer and a moisture reaction layer provided on the insulating layer (insulating layer-moisture reaction layer combination) is provided such that the combination covers an organic EL structure including the organic substance layer, the cathode, and a portion of the anode wherein the moisture reaction layer contains a metal having a Pauling's electronegativity of less than 1.2, and a preliminary moisture reaction layer comprising a water-reactive substance dispersed in a polymer binder is provided over the organic EL structure including the organic substance layer, the cathode, a portion of the anode, and the insulating layer-moisture reaction layer combination, and the preliminary moisture reaction layer is molded by use of a seal-molding agent.

2. The organic EL device according to claim 1, wherein the moisture reaction layer is formed substantially of a metal having a Pauling's electronegativity of less than 1.2.

3. The organic EL device according to claim 1, wherein a seal substrate is provided above the organic EL structure including the organic substance layer, the cathode, a portion of the anode, and the insulating layer-moisture reaction layer combination, and the seal substrate is fixed to the transparent substrate by use of an adhesive for a seal substrate.

4. The organic EL device according to claim 3, further comprising an anode insulating layer provided between the moisture reaction layer and the anode.

5. The organic EL device according to claim 1, wherein the water-reactive substance is at least one metal having a Pauling's electronegativity of less than 1.2.

6. The organic EL device according to claim 1, wherein the polymer binder is a heat-curable or photo-curable resin.

7. The organic EL device according to claim 1 further comprising an anode insulating layer provided between the moisture reaction layer and the anode.

* * * * *